(12) United States Patent
Hardee

(10) Patent No.: US 6,285,242 B1
(45) Date of Patent: Sep. 4, 2001

(54) REFERENCE VOLTAGE SHIFTER

(75) Inventor: Kim C. Hardee, Colorado Springs, CO (US)

(73) Assignee: United Microelectronics Corporation, Hsinchu (TW)

(*) Notice: Subject to any disclaimer, the term of this patent is extended or adjusted under 35 U.S.C. 154(b) by 0 days.

(21) Appl. No.: 09/492,730

(22) Filed: Jan. 27, 2000

Related U.S. Application Data

(60) Provisional application No. 60/118,677, filed on Feb. 5, 1999.

(51) Int. Cl.[7] ........................................ G05F 1/10
(52) U.S. Cl. .............................................. 327/536
(58) Field of Search ................... 327/534, 535, 327/536, 537, 538, 540, 541, 543, 545, 546, 561, 562, 563

(56) References Cited

U.S. PATENT DOCUMENTS

| 5,319,303 | * | 6/1994 | Yamada | 323/274 |
| 5,334,890 | * | 8/1994 | Hardee | 307/530 |
| 5,574,681 | * | 11/1996 | Foss et al. | 365/149 |
| 5,598,122 | * | 1/1997 | McClure | 327/538 |
| 5,614,856 | * | 3/1997 | Wilson et al. | 327/170 |
| 5,666,074 | * | 9/1997 | Chun | 327/51 |
| 6,049,237 | * | 4/2000 | Nakao | 327/103 |

OTHER PUBLICATIONS

Changhyun, Kim, "Basic Dram Operation", Feb. 1998, Samsung Electronics.*

* cited by examiner

Primary Examiner—Jeffrey Zweizig
(74) Attorney, Agent, or Firm—Stuart T. Langley; William J. Kubida; Hogan & Hartson LLP

(57) ABSTRACT

A reference voltage generator for producing a reference voltage that is a preselected amount below a power supply voltage. A reference voltage source produces a first reference voltage that is VREF above the ground potential. A first load device coupled to the ground node and generates an internal reference signal that is determined by the magnitude of current flowing in the first load device. A differential amplifier produces a signal determined by a difference between the signals on the first and second inputs. A current regulating switch having a control node coupled to the differential amplifier output, and coupled to determine the current through the first load device. A second load device coupled in series with the first load device and coupled to the power supply node has an impedance selected to cause the second load device to generate the second reference voltage.

14 Claims, 2 Drawing Sheets

REFERENCE VOLTAGE SHIFTER

This application claims the benefit of U.S. Provisional Application No. 60/118,677, filed Feb. 5, 1999.

BACKGROUND OF THE INVENTION

1. Field of the Invention

The present invention relates, in general, to integrated circuits and, more particularly, to integrated circuits having voltage generator circuits generating an internal power supply voltage from an external power supply voltage.

2. Relevant Background

Integrated circuits are manufactured with increasingly small devices spaced increasingly close together to provide greater functionality for a given chip area. Also, there is a demand for faster integrated circuits (i.e., circuits that provide the specified functionality in smaller amounts of time). These trends results in disparate demands on power supplies that power the integrated circuit. Smaller devices with small inter-device spacing require lower power supply voltages to prevent device damage and to provide adequate isolation between devices.

Typical integrated circuits are coupled to an external power supply voltage (VCC) that is, for example, 5.0 volts or 3.3 volts, although any voltage may be used. On-chip circuitry uses VCC to generate higher and lower voltages for use by internal circuitry. Dynamic random access memory (DRAM) circuits, for example, often require at least one internal voltage that is higher than the externally supplied VCC. DRAM devices store a logic signal as a voltage on a capacitor. A capacitor is accessed during reading and writing by an access transistor. A plurality of access transistors have their gates coupled to a word line. If the capacitor is storing a logic signal at the external power supply voltage, the access transistor gate must be driven to a voltage at least one threshold voltage higher than the external power supply voltage in order to turn on the access transistor. Hence, a need exists for voltage generating circuitry that generates an internal voltage higher than the externally supplied power supply voltage.

A typical solution to these problems is to provide voltage shifting circuitry on an integrated circuit to generate internal voltage supply levels (i.e., voltage supplies available on the integrated circuit) from an externally supplied voltage. An example of this is on-chip circuitry that generates a voltage higher than the externally supplied voltage for powering, for example, the word lines in a DRAM. One way to accomplish this is to generate an internal supply voltage that is above the external supply voltage VCC using a charge pump, a regulator circuit, and a filter capacitor. This higher voltage is referred to as VCCP.

A typical pump circuit turns on and off in response to a regulator signal. The comparator receives inputs to compare the pumped supply voltage VCCP to a reference voltage. One way to regulate $V_{CCP}$ is to compare a ratio of VCCP to VCC so that the VCCP is VCC multiplied by a constant. For example, by setting the comparator's reference voltage to VCC and comparing to 2/3 VCCP, the charge pump comparator will cause VCCP to regulate to 150% of VCC under all conditions.

One problem with this approach is that VCC can change in magnitude significantly over a variety of operating conditions. During device burn in, for example, VCC is increased to accelerate failure mechanisms. This increase in VCC is multiplied in the generation of VCCP and can result in unacceptably high VCCP levels. Such high VCCP levels can result in reliability problems, permanent threshold voltage shifts, and gate oxide breakdown, among other failure modes.

Another approach is to regulate VCCP to a fixed voltage above VCC (i.e., adding a fixed amount to VCC rather than multiplying VCC by a fixed amount). For example, VCCP can be set equal to VCC+VTN, where VTN is the threshold voltage drop across a typical gate access transistor. This avoids the multiplier effect at high temperatures described above, but results in a somewhat unpredictable VCCP because the threshold voltage of a gate access transistor is dependent on many parameters such as channel doping, gate oxide thickness, channel length, and temperature. VTN is also dependent on the source-to-body bias.

Hence, a need exists for a reference voltage shifter particularly for use in a charge pump circuit that is predictable and yet does not risk generating excessive voltages over an expected range of operating conditions.

SUMMARY OF THE INVENTION

The present invention involves a reference voltage generator for producing a reference voltage that is a preselected amount below a power supply voltage. A reference voltage source produces a first reference voltage that is VREF above the ground potential. A first load device coupled to the ground node and generates an internal reference signal that is determined by the magnitude of current flowing in the first load device. A differential amplifier produces a signal determined by a difference between the signals on the first and second inputs. A current regulating switch having a control node coupled to the differential amplifier output, and coupled to determine the current through the first load device. A second load device coupled in series with the first load device and coupled to the power supply node has an impedance selected to cause the second load device to generate the second reference voltage.

In another aspect, the present invention involves a method for generating a desired voltage from a supplied voltage. A reference voltage is produced on a reference node. A supply voltage is produced on a supply node. The reference voltage and a feedback signal are differentially amplified to produce a differentially amplified signal. A current through a first load device is regulated to generate the feedback signal. The regulated current is coupled to the supply node through a second load device and modulated using the differentially amplified signal such that the voltage drop across the second load device is determined by the reference voltage.

DETAILED DESCRIPTION OF THE PREFERRED EMBODIMENTS

In many circuits a reference voltage generator is included to produce a reference voltage that is a known voltage (VREF) above ground (or system common). As used herein, the term "ground" refers to a system common voltage potential that may or may not be the same as earth ground.

In general, the present invention involves a system, method and circuit for using an available reference voltage (identified as VREF in the examples) to generate one or more other reference voltages (such as a reference voltage referred to in the specific examples herein as VCOMP) that is a voltage VREF below another voltage such as a power supply voltage. In accordance with the present invention, the generated VREF is essentially subtracted from the supply voltage to generate the second reference voltage VCOMP.

The present invention is particularly useful in a charge pump regulator circuit described in the preferred implementation. However, it is contemplated that the present invention will find utility in a large number of circuits as a general purpose means for generating a reference voltage from another reference voltage. This allows a single, reliable constant output reference voltage generator to be used to generate a plurality of reference voltages in a particular circuit.

Figure 1:
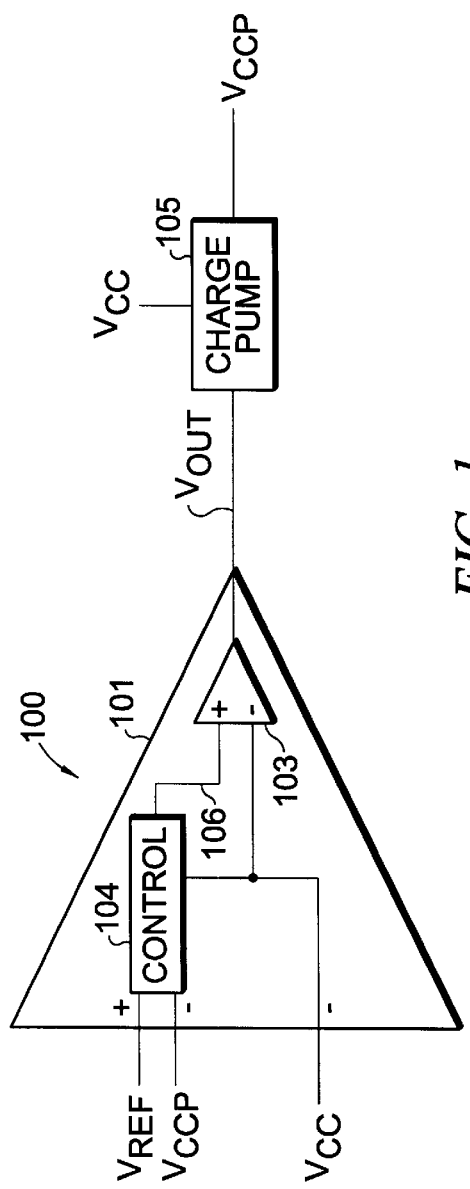
FIG. 1 illustrates an exemplary implementation of the voltage shift apparatus in accordance with the present invention in block diagram form.

FIG. 1 illustrates an exemplary implementation of the voltage shift apparatus in accordance with the present invention in block diagram form. Comparator 100 receives a reference voltage VREF from a reference voltage generator such as a bandgap reference circuit (not shown). Comparator 100 also receives a power supply voltage VCC. Charge pump circuit 105 is powered from VCC and is switched on and off by the VOUT control signal from comparator 100 to generate a pumped supply voltage VCCP. In the particular implementation, VCCP is regulated to be substantially equal to VCC plus VREF. Charge pump circuit 105 can be implemented in any available technology to meet the needs of a particular application.

Comparator 100 includes a control unit 104 coupled to VREF and VCCP to generate a control signal on node 106 called VCOMP. The signal VOUT is generated by comparing VCC to VCOMP in comparator 103. The output of comparator 103 (VOUT) drives charge pump circuit 105 that generates the pumped supply voltage VCCP. In this manner, charge pump circuit 105 is turned on and off to regulate VCCP at a magnitude substantially equal to VCC+ VREF. The charge pump is turned on if VCOMP is less than VCC and is turned off if VCOMP is greater than VCC.

Figure 2:
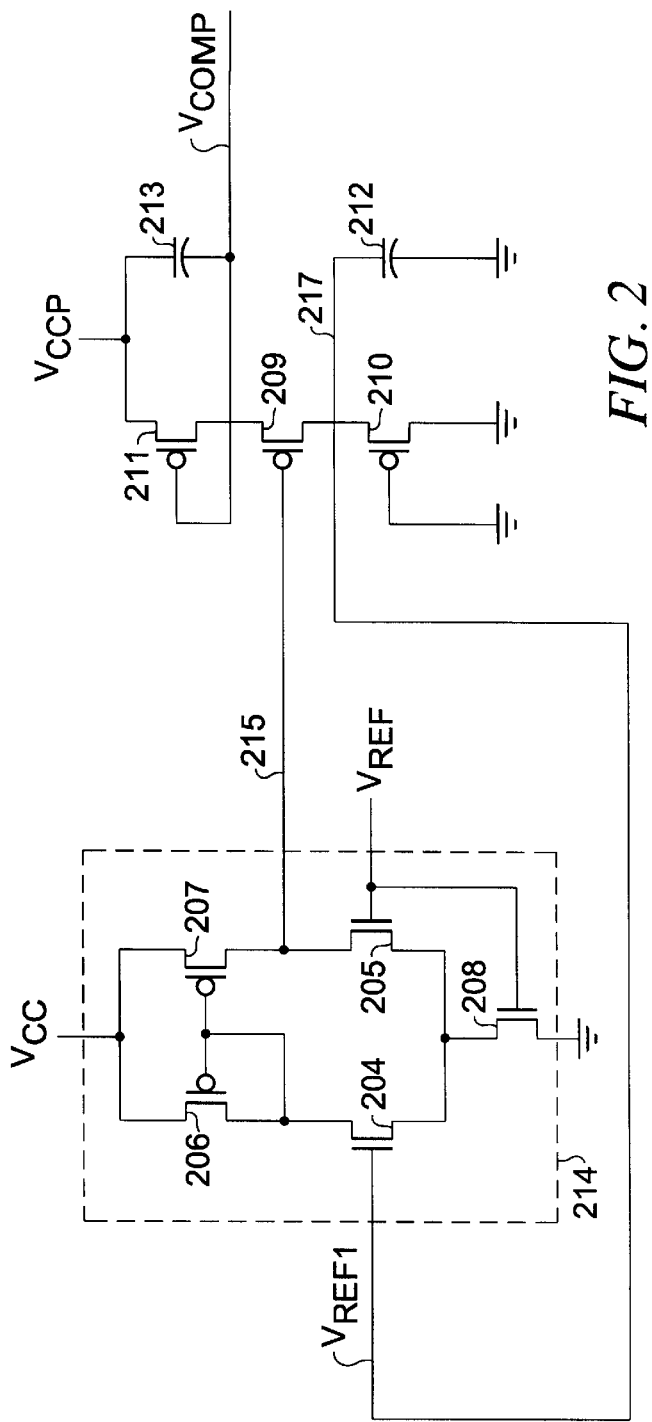
FIG. 2 schematically illustrates an embodiment in accordance with the present invention.

FIG. 2 illustrates an example embodiment of circuitry suitable to implement voltage control unit 104 shown in FIG. 1. Differential amplifier 214 comprises switches 204, 205, 206, 207, and 208. Switches 204 and 205 serve as signal inputs and comprise n-channel field effect transistors (FETs) in a particular implementation. Switches 206 and 207 are implemented as p-channel FETs and serve as load devices for left and right branches, respectively, of differential amplifier 214. Switches 206 and 207 each have one current carrying terminal coupled to receive power from the VCC supply. Switch 208, implemented as an n-channel FET, serves as a current source coupled to ground potential.

A control terminal of switch 206 is coupled to VREF. Because the reference voltage generator that produces VREF is already available on chip, and the circuitry shown in FIG. 2 minimally loads the VREF signal, accurate performance is achieved with minimal additional circuit complexity. A control terminal of switch 204 is coupled to node 217 to receive a signal referred to herein as "VREF1". In operation, when VREF1 is greater than VREF, the voltage on node 215 increases. When VREF1 is less than VREF, the voltage on node 215 decreases.

Node 215 is coupled to a control electrode of switch 209. Desirably, switch 209, switch 210 and switch 211 are implemented as series-coupled p-channel field effect transistors. Switches 210 and 211 are matched to have similar drain-to-source on-voltage by, for example, matching their channel length and width in a conventional manner. Switch 209 serves to control the amount of current in the series-coupled switches 209–211 in response to the signal on node 215.

In steady state, a signal on node 215 is driven to a level such that the voltage on node 217 is substantially equal to VREF. Because the drain-to-source current through transistor 211 the same as that through transistor 210, and transistors 210 and 211 are similarly sized, the on-voltage drop across transistor 211 will be substantially equal to the on-voltage drop across transistor 210.

In FIG. 2, capacitors 212, and 213 are added to prevent oscillation and provide faster response in cases where VCC or VCCP change levels quickly (e.g., a high load condition). Capacitor 212 is conveniently implemented as an n-channel MOS transistor with the source and drain terminals coupled to VSS (or ground) and the gate terminal coupled to node 217. Similarly, capacitor 213 is desirably implemented as a p-channel MOS transistor with a source and drain terminal coupled to VCCP and the gate terminal coupled to the VCOMP generating node. Other available capacitor implementations may be used to provide equivalent implementations.

Figure 3:
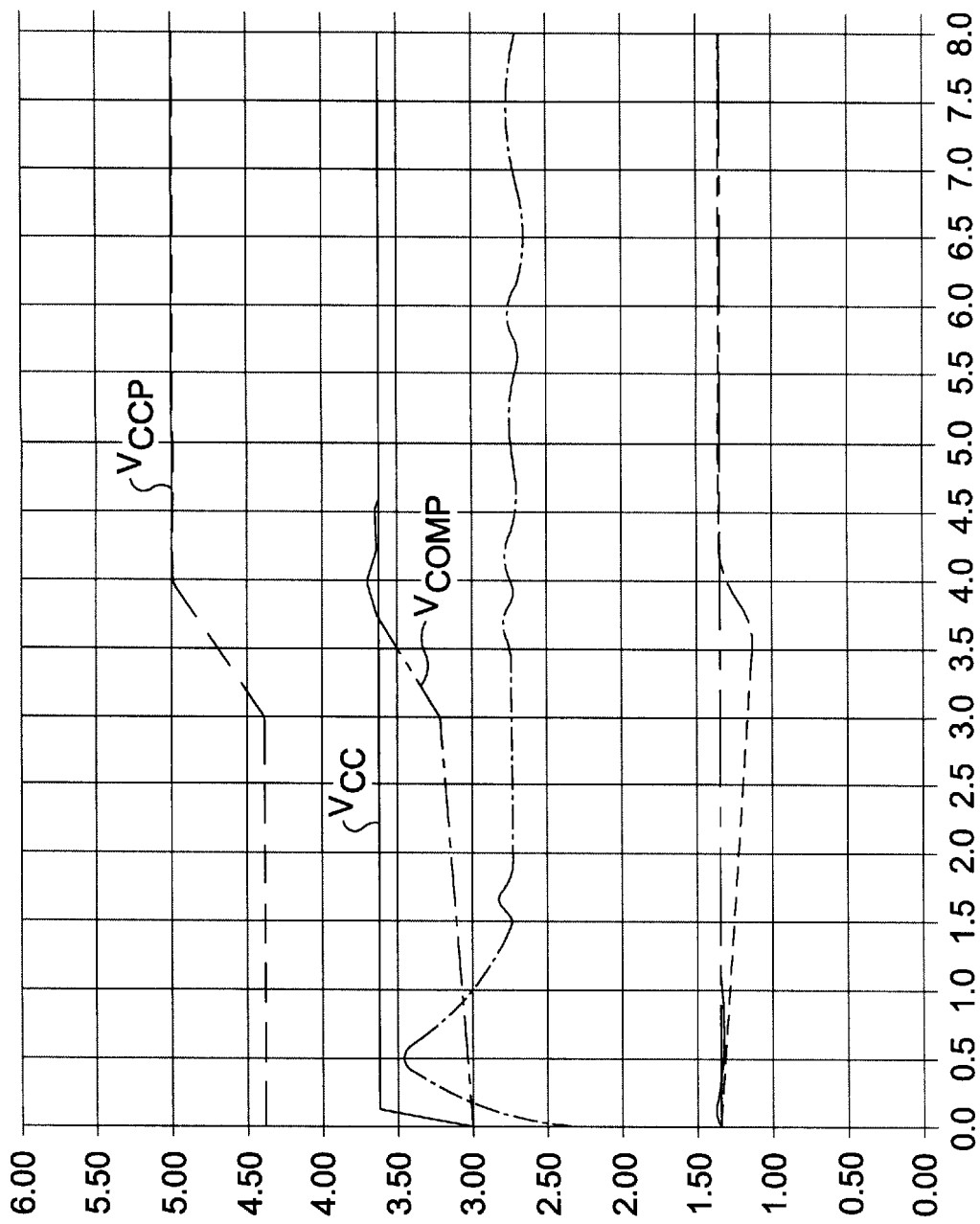
FIG. 3 shows waveform diagrams illustrating operation of the embodiment apparatus shown in FIG. 2.

FIG. 3 shows a waveform plot derived from a computer simulation of operational waveforms illustrating operation of the circuit shown in FIG. 2. In FIG. 3, the horizontal axis represents time and the vertical axis represents signal magnitude in volts. Initially, VCC is at approximately 3.0 volts and VREF is at approximately 1.4 volts. VCCP is at VCC+ VREF or approximately 4.4 volts. As described hereinbefore, at steady state, VCOMP equals VCC so charge pump unit 105 (shown in FIG. 1) is not activated.

Shortly after the time labeled 0.0, VCC increases to 3.6 V. During the time VCOMP is less than VCC, charge pump unit 105 is activated causing VCCP to increase (after a delay) as illustrated at about the time labeled 3.0 in FIG. 3. As VCCP increases, VCOMP increases also. When VCCP rises to approximately 5.0 volts, VCOMP has risen to VCC and charge pump unit 105 is deactivated. After time 4.0 in FIG. 3, a steady state condition is established where VCOMP= VCC and VCCP is regulated to a magnitude substantially equal to VCC+VREF.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. An apparatus generating a second supply voltage from an first supply voltage where the second supply voltage is greater in magnitude than the first supply voltage, the apparatus comprising:

a ground node having a ground potental thereon;

a first power supply node having the first power supply voltage thereon;

a second power supply node having the second power supply voltage thereon;

a first reference voltage generator producing a first reference voltage that is VREF above the ground potential; and a second reference voltage generator that uses the first reference voltage to generate a second reference voltage that is VREF below the second power supply voltage potential.

2. The apparatus of claim 1 further comprising:

a comparator having a non-inverting input coupled to the second reference voltage, and inverting input coupled to the first power supply node, and an output producing a control signal; and a charge pump circuit coupled to the first power supply node and responsive to the control signal to generate the second power supply voltage.

3. The apparatus of claim 1 wherein the second reference voltage is substantially equal to the first supply voltage in steady state.

4. The apparatus of claim 1 wherein the second reference voltage generator further comprises:

a differential amplifier having an inverting input node coupled to the reference voltage generator, a non-inverting input node, and an output node; and an output stage comprising a current regulating switch, the current regulating switch having a first node producing the second reference voltage, a second node coupled to the non-inverting output of the differential amplifier, and a control node operatively coupled to the differential amplifier output node.

5. The apparatus of claim 4 wherein the output stage further comprises:

a first load device coupled between the second power supply node and the first node of the current regulating switch; and a second load device coupled between the ground node and the second node of the current regulating switch.

6. The apparatus of claim 5 wherein the current regulating switch comprises a p-channel field effect transistor having a source coupled to first load device and a drain coupled to the second load device.

7. The apparatus of claim 5 wherein the first and second load devices comprise matched impedance devices.

8. A reference voltage generator for producing a second reference voltage that is a preselected amount below a power supply voltage, the reference voltage generator comprising:

a ground node having a ground potential thereon;

a power supply node having the power supply voltage thereon;

a reference voltage source producing a first reference voltage that is VREF above the ground potential;

a first load device coupled to the ground node and generating an internal reference signal that is determined by the magnitude of current flowing in the first load device;

a differential amplifier having a first input coupled to the first reference voltage, a second input coupled to the internal reference signal, and an output generating a signal determined by a difference between the signals on the first and second inputs;

a current regulating switch having a control node coupled to the differential amplifier output, and coupled to determine the current through the first load device; and a second load device coupled in series with the first load device and coupled to the power supply node, wherein the second load device has an impedance selected to cause the second load device to generate the second reference voltage wherein the second reference voltage is a preselected amount below the power supply potential.

9. The voltage shift circuit of claim 8 wherein the first and second load devices are impedance matched.

10. The voltage shift circuit of claim 8 wherein the first and second load devices comprise matched field effect transistors.

11. A method for generating a desired voltage from a supplied voltage comprising:

providing a reference voltage on a reference node;

providing a supply voltage on a supply node;

differentially amplifying the reference voltage with a feedback signal to produce a differentially amplified signal;

regulating a current through a first load device to generate the feedback signal;

coupling the regulated current to the supply node through a second load device; and modulating current through the first and second load devices using the differentially amplified signal such that the voltage drop across the second load device is determined by the reference voltage.

12. The method of claim 11 wherein the act of regulating a current through a first load device is performed so that an on-voltage across the first load device is substantially equal to the reference voltage.

13. The method of claim 12 wherein the act of coupling the regulated current comprises conducting the regulated current in series from the first load device through the second load device.

14. An apparatus for generating a desired voltage that is a fixed amount below a supplied voltage comprising:

a supply node having the supplied voltage thereon;

a current path conducting current from the supply node;

a current regulating switch within the current path;

first and second load devices in the current path and operatively coupled to the current regulating switch so that the same current flows in each of the first and second load devices, wherein the first and second load devices have an on-voltage determined by the current flowing in the current path; and a feedback circuit coupled to sense the on-voltage of the first load device and to maintain the on-voltage across the first load device at a preselected level by controlling the current regulating switch.

* * * * *